(12) United States Patent
Bencher

(10) Patent No.: US 11,994,804 B2
(45) Date of Patent: May 28, 2024

(54) LITHOGRAPHY APPARATUS, PATTERNING SYSTEM, AND METHOD OF PATTERNING A LAYERED STRUCTURE

(71) Applicant: Applied Materials, Inc., Santa Clara, CA (US)

(72) Inventor: Christopher Dennis Bencher, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/755,276

(22) PCT Filed: Nov. 18, 2020

(86) PCT No.: PCT/US2020/061067
§ 371 (c)(1),
(2) Date: Apr. 26, 2022

(87) PCT Pub. No.: WO2021/102006
PCT Pub. Date: May 27, 2021

(65) Prior Publication Data
US 2022/0373897 A1     Nov. 24, 2022

Related U.S. Application Data

(60) Provisional application No. 62/937,712, filed on Nov. 19, 2019.

(51) Int. Cl.
*G03F 7/20*     (2006.01)
*G03F 7/00*     (2006.01)

(52) U.S. Cl.
CPC ...... *G03F 7/70208* (2013.01); *G03F 7/70275* (2013.01); *G03F 7/70316* (2013.01); *G03F 7/70575* (2013.01)

(58) Field of Classification Search
CPC ............. G03F 7/70208; G03F 7/70275; G03F 7/70316; G03F 7/70575; G03F 7/0045;
(Continued)

(56) References Cited

U.S. PATENT DOCUMENTS

| 5,739,898 A | 4/1998 | Ozawa et al. |
| 2006/0215143 A1 | 9/2006 | Yamaguchi et al. |

(Continued)

FOREIGN PATENT DOCUMENTS

| JP | H09-007935 A | 1/1997 |
| JP | 2006301591 A | 11/2006 |

(Continued)

OTHER PUBLICATIONS

Internatinal Search Report/ Written Opinion issued to PCT/US2020/061067 dated Apr. 21, 2021.
(Continued)

*Primary Examiner* — Mesfin T Asfaw
(74) *Attorney, Agent, or Firm* — Patterson + Sheridan, LLP

(57) ABSTRACT

Embodiments of the present disclosure include a lithography apparatus, patterning system, and method of patterning a layered structure. The patterning system includes an image formation device and a reactive layer. The patterning system allows for creating lithography patterns in a single operation. The lithography apparatus includes the patterning system and an optical system. The lithography apparatus uses a plurality of wavelengths of light, along with the image formation device, to create a plurality of color patterns on the reactive layer. The method of patterning includes exposing the reactive layer to a plurality of wavelengths of light. The light reacts differently with different regions of the reactive layer, depending on the wavelength of light emitted onto the different regions. The method and apparatuses
(Continued)

disclosed herein require only one image formation device and one lithography operation.

22 Claims, 8 Drawing Sheets

(58) Field of Classification Search
CPC ...... G03F 7/0236; G03F 7/0392; G03F 7/095; G03F 7/2057; G03F 7/7005; G03F 7/70291; G03F 7/70466; G03F 7/203; H01L 21/0274
See application file for complete search history.

(56) References Cited

U.S. PATENT DOCUMENTS

| | | | |
|---|---|---|---|
| 2007/0139633 A1 | 6/2007 | Bleeker et al. | |
| 2007/0273858 A1 | 11/2007 | Nagasaka | |
| 2008/0013062 A1* | 1/2008 | Nagasaka | G03F 7/70458 355/53 |
| 2012/0178027 A1 | 7/2012 | Chen et al. | |
| 2013/0083302 A1* | 4/2013 | Wu | G03F 7/70575 355/27 |
| 2013/0084526 A1 | 4/2013 | Wu et al. | |
| 2013/0084532 A1 | 4/2013 | Wu et al. | |

FOREIGN PATENT DOCUMENTS

| | | |
|---|---|---|
| JP | 2007334036 A | 12/2007 |
| JP | 2014207414 A | 10/2014 |
| JP | 6215560 B2 | 10/2017 |
| JP | 2019-095695 A | 6/2019 |
| KR | 10-2013-0030869 A | 3/2013 |
| WO | 2007094470 A1 | 8/2007 |
| WO | 2007119501 A | 8/2009 |

OTHER PUBLICATIONS

Japanese Office Action issued to patent application No. 2022-527671 dated Jul. 11, 2023.
European Search Report issued to Patent Application No. 20889663.9 dated Nov. 20, 2023.
Japanese Office Action dated Dec. 8, 2023 for patent application JP 2022-527671.

* cited by examiner

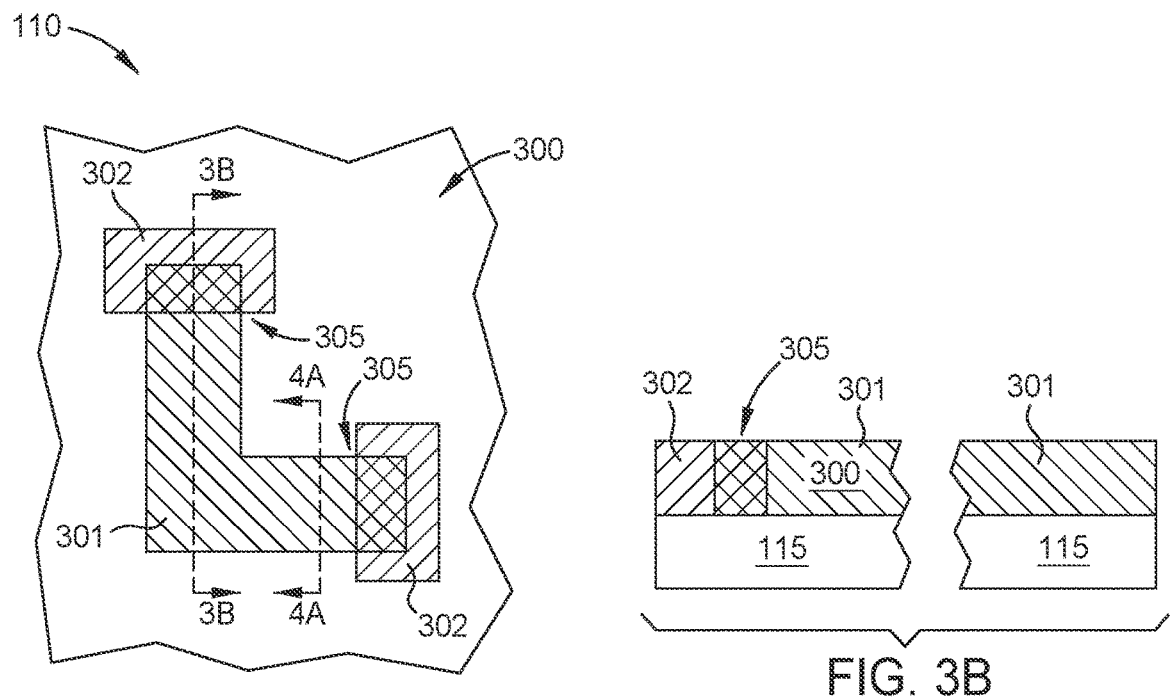
FIG. 3A
FIG. 3B
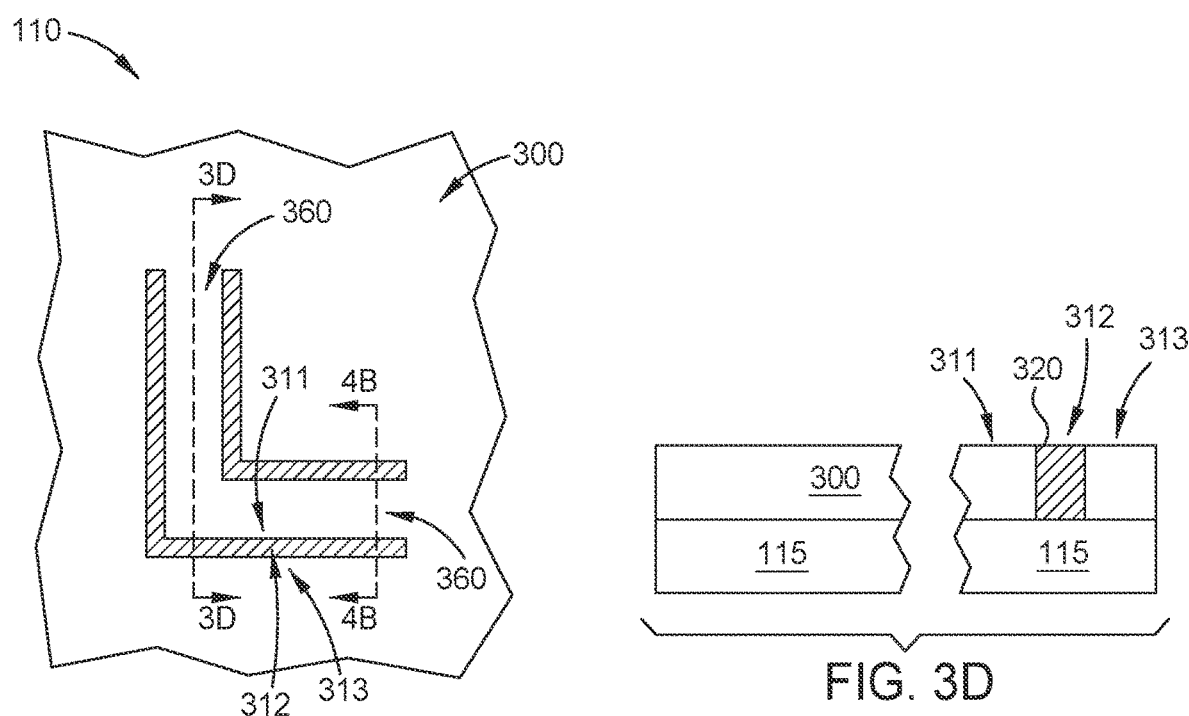
FIG. 3C
FIG. 3D

LITHOGRAPHY APPARATUS, PATTERNING SYSTEM, AND METHOD OF PATTERNING A LAYERED STRUCTURE

BACKGROUND

Field

Embodiments of the present disclosure relate to an apparatus and a method and, more specifically, to a lithography apparatus, a patterning system, and a method of patterning a layered structure.

Description of the Related Art

Photolithographic technology plays an important role in the manufacture of integrated circuit (IC) chips. Continued improvements in optical projection lithography have enabled the printing of ever-finer features of integrated circuits. This, in turn, has allowed the integrated circuit industry to produce ever more powerful and cost-effective semiconductor devices.

In the field of optical lithographic processing, a photosensitive material is applied to a substrate and then allowed to dry. An exposure tool is utilized to expose the photosensitive material coated substrate with proper geometrical patterns through a mask by means of a source of light or radiation. After exposure, the wafer is treated to develop the mask images transferred to the photosensitive material. These masking patterns are then used to form the device features of the circuit.

When the pattern resolution requirements of a single design layer exceed the capabilities of the exposure tool, one may work-around the limitations by dividing the pattern into multiple iterations of lithography. One drawback is that many photolithography patterns use multiple masks in multiple steps that require taking the substrate after the first patterning and adding a second mask, slowing the lithography process and adding cost to the user. In addition, placing a second mask requires careful alignment. Alignment errors can result in misaligned patterns, wasting resources and requiring extra time to correct.

Therefore, there is a need for improved lithography methods and it would be valuable to reduce the required number of patterning steps.

SUMMARY

Embodiments herein include a lithography apparatus, patterning system, and method of patterning a layered structure. The apparatus and methods provided herein can perform enhanced resolution lithography processes in a single lithography operation, without requiring multiple photoresist applications, development steps, etch processes or requiring multiple masks.

In one embodiment, a lithography apparatus is provided, including a substrate support configured to support a layered structure, a light source system able to emit light at two or more wavelengths, an image formation device able to receive the two or more wavelengths of light generated by the light source system and generate two or more light images at the two or more wavelengths received from the light source system.

In another embodiment, a patterning system is provided, including an image formation device and a photo-sensitive reactive layer. The reactive material includes a first region and a second region. The image formation device is configured to allow a first wavelength of light onto the first region, and the image formation device is configured to allow a second wavelength of light onto the second region.

In yet another embodiment, a method of patterning a layered structure is provided, including disposing a reactive layer over the layered structure and exposing the reactive layer to a plurality of wavelengths of light through an image formation device. The reactive layer includes a reactive material. The reactive material includes a first region and a second region. The exposing the reactive layer includes exposing the first region to light of a first wavelength and exposing the second region to light of a second wavelength.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3A illustrates a top view of a portion of a reactive layer, according to one or more embodiments described and discussed herein.

FIG. 3B illustrates a cross-sectional side view of a portion of a reactive layer, according to one or more embodiments described and discussed herein.

FIG. 3C illustrates a top view of a portion of a reactive layer, according to one or more embodiments described and discussed herein.

FIG. 3D illustrates a cross-sectional side view of a portion of a reactive layer, according to one or more embodiments described and discussed herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure include a lithography apparatus, patterning system, and method of patterning a layered structure. The patterning system includes a multiple wavelength light source, an image formation device, and a reactive layer with multiple behavior corresponding to the multiple wavelengths of light. The patterning system allows for creating two or more distinct lithography patterns at two or more distinct wavelengths. The lithography apparatus includes the patterning system and an optical system. The lithography apparatus uses a plurality of wavelengths of light which can be discretely directed by the image formation device to form a plurality of patterns and/or images on the reactive layer. The method of patterning includes exposing the reactive layer to a plurality of wavelengths of light. Light of different wavelengths is exposed onto different regions of the reactive layer. The different regions of the reactive layer react differently, depending on the wavelength of exposed light. The method and apparatuses disclosed herein require only one lithography operation. In addition, the use of a single illumination operation reduces the need for alignment of multiple masks in multiple steps, reducing time of lithography. Embodiments herein may be useful for, but are not limited to, a lithography apparatus configured to provide multiple wavelengths of light to two different portions of a reactive layer.

Figure 1:
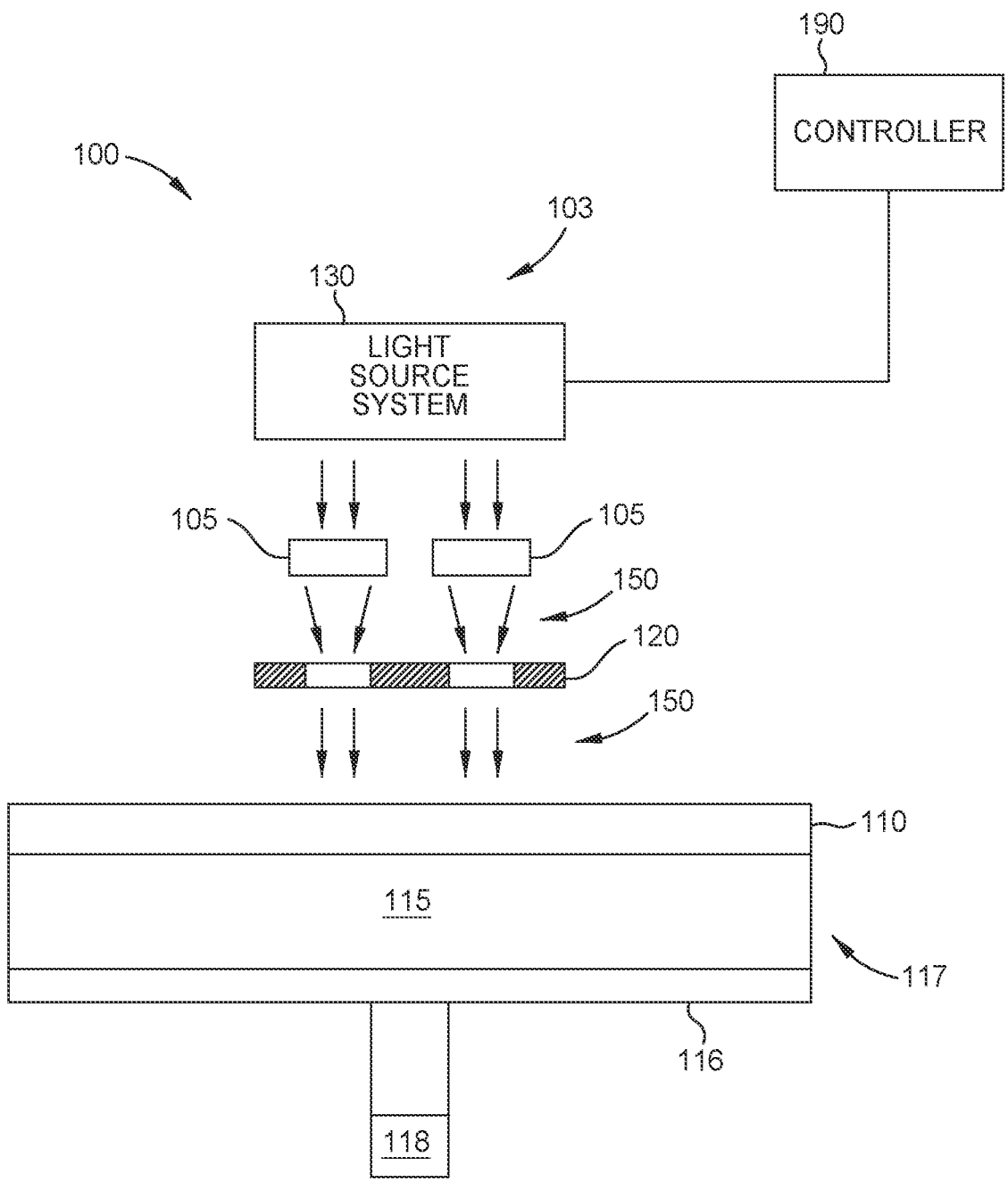
FIG. 1 illustrates a lithography apparatus, according to one or more embodiments described and discussed herein.

FIG. 1 illustrates a lithography apparatus 100, according to one or more embodiments described and discussed herein. The lithography apparatus 100 is configured to emit a plurality of different wavelength images onto a layered structure 117 below. The lithography apparatus 100 can be any lithography tool used in the art, such as, but not limited to, a mask based lithography tool, or a maskless (direct write) lithography tool either of a raster-beam architecture of a multi-beam array architecture.

As shown, the lithography apparatus 100 includes an optical system 103, a patterning system 150, a substrate support 116, and a controller 190. The substrate support 116 is configured to support a layered structure 117. The substrate support 116 is attached to a support actuator 118. The support actuator 118 is configured to move the substrate support 116 anywhere in three-dimensional space. For example, the substrate support 116 is lowered to receive the layered structure 117 from a robot (not shown) outside of the lithography apparatus 100.

The layered structure 117 is used as a workpiece for a variety of semiconductor devices, printed circuit-boards, flat-panel displays, and/or other MEMS, optical devices, and the like. As shown, the layered structure 117 includes a substrate 115. The substrate 115 can be any substrate used in the art. For example, the substrate 115 includes a semiconducting material, e.g., silicon (Si), germanium (Ge), silicon germanium (SiGe), and/or a III-V semiconductor such as gallium arsenide (GaAs). In another example, the substrate 115 includes a transparent material, e.g. glass and/or plastic. The substrate 115 can have any number of insulating, semiconducting, or metallic layers thereon.

The optical system 103 is configured to emit and control a plurality of discrete wavelength images of light on the layered structure 117 below. As shown, the optical system 103 includes one or more projection lenses 105 and a light source system 130. The light source system 130 is configured to emit light at a plurality of wavelengths, for example, two wavelengths. The wavelengths emitted by the light source system can be anywhere in the electromagnetic system, e.g., ultraviolet (UV) light, visible light, or infrared (IR) light. The light source system emits light at a first wavelength of about 240 nm to about 250 nm (e.g., deep ultraviolet (DUV) light) and a second wavelength of about 300 nm to about 375 nm (e.g., UV or i-line light), according to one or more embodiments described and discussed herein. The wavelengths of light are chosen by one skilled in the art depending on the photo-sensitive reactants inside the reactive layer, as described in more detail below.

The light source system 130 can include a single light source, or a plurality of light sources, e.g., a first light source and a second light source. The first and second light sources are configured to emit the first and second wavelengths of light, according to one or more embodiments described and discussed herein. The light source system 130 includes a single light source that sequentially emits the wavelengths of light, according to one or more embodiments described and discussed herein. The light sources can be any of those used in the art, such as light-emitting diodes (LEDs), laser diodes, vertical cavity surface emitting laser diodes (VCSEL), excimer lasers (such as krypton fluoride (KrF) or argon fluoride (ArF) lasers), frequency multiplied lasers (such as a 1.06 μm frequency neodymium-doped yttrium aluminum garnet (Nd:$Y_3Al_5O_{12}$) [Nd:YAG] laser, frequency tripled to 353 nm or frequency quadrupled tripled to 266 nm), a conventional mercury halogen lamp with an alternative band-pass filter alternating between about 365 nm and about 405 nm, or other light source combinations which match the plurality of photo-sensitive reactant behaviors within the reactive layer.

The one or more projection lenses 105 can be any projection lens used in the art (e.g., spherical, cylindrical) and contain any suitable layers or coating thereon. The optical system 103 can further include a beam splitter (not shown) to focus the light source system 130 onto the patterning system 150 below. The beam splitter focuses light emitted from a plurality of light sources onto a single projection lens, and the projection lens focuses the light onto the patterning system 150, according to one or more embodiments described and discussed herein. Light emitted from a plurality of light sources is focused by the one or more projection lenses 105, and the projection lenses focuses the light onto the patterning system 150, according to one or more embodiments described and discussed herein.

The patterning system 150 is configured to pattern a desired pattern onto the layered structure 117. As shown, the patterning system 150 includes an image formation device 120 and a reactive layer 110. The image formation device 120 can be any used in the art for photolithography. The image formation device 120 is configured to allow light to pass therethrough in a predefined area. The image formation device 120 can include any masks used in the art for lithography, such as a photomask, virtual mask, and/or digital mask (e.g., a spatial light modulator, such as a Digital Micro Mirror Device (DMD)). The image formation device 120 can include any number or combination of masks, e.g., one mask with two different color blocking patterns, or two photomasks.

The image formation device 120 is operable to receive the two or more wavelengths of light generated by the light source system 130 and generate two or more light images at the two or more received wavelengths. The image formation device 120 can include any number of regions, and each region is configured to allow light onto a certain portion of the reactive layer 110. In some embodiments, the image formation device 120 includes a plurality of photomasks, and each photomask is configured to receive a different wavelength of light. In some embodiments, the image formation device 120 includes a multicolor mask, and the multicolor mask absorbs certain wavelengths at certain portions of the mask, while allowing transmission of other wavelengths at the same portion of the mask. In some embodiments, the image formation device 120 includes a plurality of photomask layers, and each photomask layer is configured to transfer a different wavelength of light.

The image formation devices 120 include one or more digital micromirror devices (DMDs), according to one or more embodiments described and discussed herein. The one or more DMDs are configured to form a virtual mask. In some embodiments, a plurality of color images are combined to make one or more compound images.

In some embodiments, one or more additional projection lenses (not shown) are disposed between the image formation device 120 and the reactive layer 110. The one or more additional projection lenses further focus light passing through the image formation device 120 onto the reactive layer 110 disposed under the image formation device.

In one or more embodiments, the lithography apparatus 100 includes an image formation device 120 including two photomasks, a light source system 130 including two light sources, a beam splitter, and a projection lens, and the beam splitter focuses light emitted from the two light sources onto the projection lens.

In one or more embodiments, the lithography apparatus 100 includes an image formation device 120 including two photomasks, a light source system 130 including two light sources, two projection lens, and light emitted from the two light sources is each focused onto one of the projection lenses.

In one or more embodiments, the lithography apparatus 100 includes an image formation device 120 including two virtual masks (e.g., two DMDs), a light source system 130 including two light sources, a beam splitter, and a projection lens, and the beam splitter focuses light emitted from the two light sources onto the projection lens.

In one or more embodiments, the lithography apparatus 100 includes an image formation device 120 including two virtual masks (e.g., two DMDs), a light source system 130 including two light sources, two projection lens, and light emitted from the two light sources is each focused onto one of the projection lenses.

In one or more embodiments, the lithography apparatus 100 includes an image formation device 120 including a virtual mask (e.g., a DMD), a light source system 130, and the light source system includes a single light source that sequentially emits wavelengths of light.

In one or more embodiments, the lithography apparatus 100 includes an image formation device 120 including a multicolor mask, an optical device 104, a light source system 130, and the light source system includes a single light source that sequentially emits wavelengths of light.

The controller 190 is configured to control and automate the lithography apparatus 100. As shown, the controller 190 includes a central processing unit (CPU) (not shown), memory (not shown), and support circuits (or I/O) (not shown). The CPU is one of any form of computer processors that are used in industrial settings for controlling various processes and hardware (e.g., pattern generators, motors, and other hardware) and monitor the processes (e.g., processing time and substrate position or location). The memory (not shown) is connected to the CPU, and is one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits include conventional cache, power supplies, clock circuits, input/output circuitry, subsystems, and the like. A program (or computer instructions) readable by the controller 190 determines which tasks are performable by the lithography apparatus 100.

The reactive layer 110 is configured to react to different wavelengths of light. In some embodiments, different portions of the reactive layer 110 can be configured to react to different wavelengths of light. The reactive layer 110 has a first region configured to react to a first wavelength of light, and a second region configured to react to a second wavelength of light, according to one or more embodiments described and discussed herein. The first region and the second region at least partially overlap, according to one or more embodiments described and discussed herein.

In other embodiments, the reactive layer 110 contains a uniform material. In these embodiments, different portions of the reactive layer 110 are exposed to different wavelengths of light. Thus, the different portions (e.g., the first and second regions) of the reactive layer 110 react differently because of the wavelength of light the portion is exposed to, although the material of each portion is the same. The first region and the second region at least partially overlap, according to one or more embodiments described and discussed herein.

The reactive layer 110 can contain any material that is photoactive at specific spectrums of light. For example, the reactive layer 110 includes a first metal that is more photoactive at a first wavelength, and the reactive layer 110 includes a second metal that is more photoactive at a second wavelength. In another example, the reactive layer 110 includes a first polymer that is more photoactive at a first wavelength, and the reactive layer 110 includes a second polymer that is more photoactive at a second wavelength.

The light incident on the reactive layer 110 can have a gradient of intensity, e.g., a Gaussian pattern. Thus, the dose of light in different portions of the reactive layer 110 can receive different doses of light. The material of the reactive layer 110 can change aqueous solubility depending on the dosage of light applied. Thus, a material can have regions that are either soluble, partially soluble, or insoluble, depending on the dose of the light applied.

In some embodiments, the solubility of the material does not change until a treating process is applied to the reactive layer 110, such a post-exposure bake. The treating process can include heating the reactive layer 110 to a temperature of about 70° C. to about 200° C. for about 10 seconds to about 300 seconds.

The reactive layer 110 can include one or more photoacid generators (PAGs) and/or photobase generators (PBGs). PAGs include functional groups that generate acid, such as hydrogen and/or protons upon absorption of specific wavelengths of light. PAGs generate strong acids due to photodissociation, and/or to the dissociation of protons upon photoassociation (e.g., ring-closing). PBGs include functional groups that generate base ions (such as amine compounds) upon absorption of specific wavelengths of light. PAGs and PBGs can be photoactive at the same or different wavelengths.

In addition, PAGs and PBGs that become photoactive at the same wavelength can have rates of acid and base formation and/or acid base concentration that are different. Also, PAGs and PBGs that become photoactive at the same wavelength can have rates of acid and base formation and/or acid base concentration that depend on the dose of the light absorbed. Thus, a material including both PAGs and PBGs that are active at about the same wavelength can have regions that are either acidic, basic, or neutral depending on the dose of the light and the wavelength of light applied to the region.

The solubility of the material can vary with the acidity/basicity of the material. For example, the material includes polymers containing aqueous solubility blockers, or protection groups. When a large enough number of PAGs are activated, the solubility groups are cleaved by acidic molecules, or deprotected, the acid unwinds the polymer chain of the material, and the material becomes more soluble. If the PBGs are also activated, the basic molecules neutralize the acidic molecules, protecting the solubility groups, the polymers do not unwind, and the material remains insoluble or less soluble. The PBGs can also induce polymer cross-linking in the material, which reduces the effectiveness of the acid deprotection. Thus, a material including both PAGs and PBGs that are active at about the same wavelength can have regions that are either soluble, partially soluble, or insoluble, depending on the dose of the light and the wavelength of light applied.

The light incident on the reactive layer 110 can have a gradient of intensity, e.g., a Gaussian pattern. Thus, different portions of the reactive layer 110 can receive different doses of light. Therefore, different portions of the reactive layer 110 containing both a PAG and a PBG active at the same wavelength can be acidic, basic, or neutral depending on the dose of light received.

In one or more embodiments, the reactive layer 110 includes a first PAG and a first PBG. The first PAG and the first PBG are active at a first wavelength of light.

At a high dose of light of the first wavelength, the PBG produces more basic molecules than the PAG produces acidic molecules, and a high dose region is produced in the first region. The higher basicity of the high dose region can make the high dose region more or less soluble that the unreacted first region. Therefore, the high dose region can be easier or more difficult to etch away as the unreacted portion. In some embodiments, the high dose region has the same solubility as the unreacted portion. The high dose region has at least about 10% to 20% net basic molecules than acidic molecules, according to one or more embodiments described and discussed herein.

In one or more embodiments, the high dose region will have a net base concentration which, upon post exposure bake, will not generate deprotection of the poly-t-BOC and therefore remain insoluble in an aqueous base developer, such as tetramethylammonium hydroxide (TMAH).

At a medium dose of light of the first wavelength, the PAG produces more acidic molecules than the PBG produces basic molecules, and a medium dose region is produced in the first region. The higher acidity of the medium dose region can make the medium dose region less or more soluble that the unreacted first region. Therefore, the medium dose region can be more difficult or easier to etch away as the unreacted portion. The medium dose region has at least about 10% to 20% net acidic molecules than basic molecules, according to one or more embodiments described and discussed herein.

In one or more embodiments, the medium dose region has a net acid concentration, which, upon post exposure bake, will cause a net deprotection of the poly-t-BOC and will be soluble in an aqueous base developer, such as TMAH.

At a low dose of light of the first wavelength, the PAG produces very few acidic molecules, and the PBG produces very few basic molecules, and a low dose region is produced in the first region. The neutrality of the low dose region has about the same solubility of the unreacted first region. Therefore, the low dose region is about the same difficulty to etch away as the unreacted portion.

In one or more embodiments, the low dose region, upon post exposure bake, will not generate deprotection of the poly-t-BOC and therefore remain insoluble in an aqueous base developer such as TMAH.

In one or more embodiments, which can be used with the embodiments described below, above, or alone, the first PBG is also photoactive at a second wavelength of light, whereas the first PAG is not photoactive at the second wavelength of light. At a high dose of light of the second wavelength, the first PBG produces basic molecules. The higher basicity of the high dose region can make the high dose region more or less soluble that the unreacted first region. Therefore, the high dose region can be easier or more difficult to etch away as the unreacted portion. In some embodiments, the high dose region has the same solubility as the unreacted portion.

In one or more embodiments, which can be used with the embodiments described below, above, or alone, the reactive layer 110 further includes a second PBG photoactive at a second wavelength of light, whereas the first PAG is not photoactive at the second wavelength of light. At a high dose of light of the second wavelength, the PBG produces basic molecules. The higher basicity of the high dose region can make the high dose region more or less soluble that the unreacted first region. Therefore, the high dose region can be easier or more difficult to etch away as the unreacted portion. In some embodiments, the high dose region has the same solubility as the unreacted portion.

In one or more embodiments, which can be used with the embodiments described below, above, or alone, the reactive layer 110 includes a first PAG and a first PBG. The first PAG and the first PBG are active at a first wavelength of light. The reactive layer 110 also includes a second PBG photoactive at a second wavelength of light. The dose of light of the second wavelength in a portion of the reactive layer 110 is large enough such that the second PBG produces a large number of basic molecules. When the portion receives a first wavelength of light, the first PAG produces acidic molecules, but the number of acidic atoms is smaller than the number of basic molecules produced by the first and second PBG. Thus, the solubility of the portion is not reduced. The reactive layer 110 has a dual-tone behavior (e.g., the dose of light received at a given portion of the reactive layer 110 results in either a soluble portion [the first tone] or an insoluble portion [the second tone]). In other embodiments, multiple ranges of solubility are produced, and thus the reactive layer 110 has a multi-tone behavior.

In other embodiments, the reactive layer 110 further includes a photo cross-linker in addition to or instead of the PBG. In other embodiments, additional PAGs and PBGs are included in the material, which allow for more than two photoactive wavelengths. In other embodiments, the first PBG is also photoactive at the second wavelength of light.

In some embodiments, the solubility of the reactive layer 110 does not change until the reactive layer 110 undergoes a treating process. In these embodiments, the first and second wavelengths can be applied in either order, as long as the portion containing the first and/or second PBG receives the second wavelength before the treating process. The treating process can include a thermal baking process. The baking process provides thermal energy for acidic molecules to diffuse to polymer protection groups, and the bake provides reaction energy to drive the deprotection reaction. In the case where a PBG is present, the thermal bake provides activation energy for diffusion of the basic molecules to occur, enabling the basic molecules to contact and neutralize acids.

In one or more embodiments, the material of the reactive layer 110 includes one or more novolak resins and a cross-linking compound including diazonaphthoquinone ($C_{10}H_6N_2O$) [DNQ] and a bis(azide). Exemplary novolak resins can be or include one or more phenol-formaldehyde (PF) resins with a formaldehyde to phenol molar ratio of less than one. When the DNQ is photoactivated, the solubility of the novolak resin is increased. When the bis(azide) is photoactivated, the bis(azide) cross-links the novolak resin, and the novolak resin is insoluble or less soluble. The DNQ is photoactive to light at a first wavelength of about 350 nm to about 425 nm, and the bis(azide) is photoactive to light at a second wavelength of either less than about 350 nm or greater than about 425 nm. The material of the reactive layer 110 becomes more soluble at the first wavelength and less soluble or insoluble at the second wavelength.

In other embodiments, the material includes polymer resin such as poly-t-BOC (poly(tert-butoxycarbonyloxystyrene)) with a first region containing of a PAG (such as iodonium triflate) and a second region containing of a PBG (such as nitroveratryloxycarbonyl (NVOC) piperidine). When exposed to a first wavelength of light of about 240 nm to about 250 nm, the reactive layer 110 will have one behavior, as both the PAG iodonium triflate and the PBG NVOC piperidine are reactive to light of the first wavelength. When the reactive layer 110 is exposed to a second wavelength of light of about 300 nm to about 375 nm, the reactive layer 110 will have a second reactive behavior, since only the PBG NVOC piperidine is reactive in this wavelength band. At the first wavelength of light, both the PAG and the PBG are photo-active, such that dual tone behavior can be established. At the second wavelength of light, only the PBG generator is photo-active, which will neutralize any acid attempting to deprotect the poly-t-BOC photo-resist.

Figure 2:
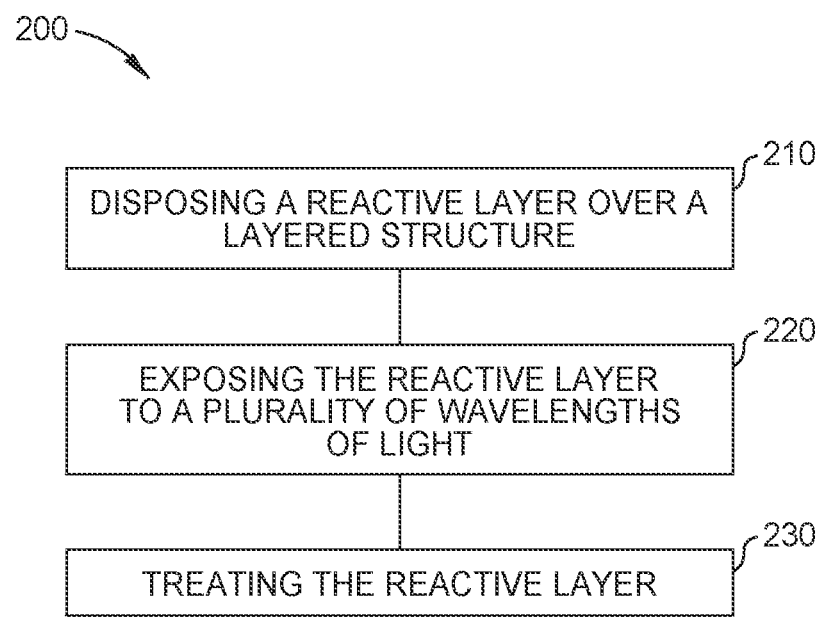
FIG. 2 is a flow diagram of method operations for patterning a layered structure, according to one or more embodiments described and discussed herein.

FIG. 2 is a flow diagram of a method 200 which includes operations for patterning a layered structure, according to one or more embodiments described and discussed herein. Although the method operations are described in conjunction with FIGS. 2, 3A-3F, 4A-4C, 5A-5C, and 6 persons skilled in the art will understand that any system configured to perform the method operations, in any order, falls within the scope of the embodiments described herein. The method 200 can be stored or accessible to the controller 190 as computer readable media containing instructions, that when executed by a processor of the controller 190, cause the lithography apparatus 100 to perform the method 200.

The method 200 begins at operation 210, where a reactive layer 110 is disposed over a substrate to produce a layered structure. In one or more embodiments, the reactive layer 110 is disposed over the layered structure 117. The reactive layer 110 can be disposed using any standard method. For example, the reactive layer 110 can be deposited by wet-coat deposition, spin-on coating process, and/or the like.

In one or more embodiments, the reactive layer 110 includes a pre-mixed photo-resist, and the PAG and PBG is mixed into the photo-resist. The photo-resist is spin-coated onto the layered structure. The photo-resist is baked at a temperature of about 50° C. to about 150° C. for about 30 seconds to about 300 seconds. The bake evaporates solvents, resulting in a polymer thin-film photo-resist.

FIG. 3A illustrates a top view of a portion of the reactive layer 110, according to one or more embodiments described and discussed herein. FIG. 3B illustrates a cross-sectional side view of a portion of the reactive layer 110, according to one or more embodiments described and discussed herein. FIGS. 3A-3B illustrate the reactive layer 110 after the reactive layer 110 is disposed on the substrate 115. As shown, the reactive layer 110 includes one or more photo-sensitive chemical compounds (reactive material 300) designed to generate different reaction results at different wavelengths of light.

In one or more embodiments, the reactive material 300 includes a first PAG, such as iodonium triflate, a first PBG, such as nitroveratryloxycarbonyl (NVOC) piperidine, and the first PAG and the first PBG are photoactive at a first wavelength of 240 nm to about 250 nm. The first PBG is also photoactive at a second wavelength of about 300 nm to about 375 nm.

As shown, the reactive material 300 includes a first region 301, two second regions 302, and two overlap regions 305. The first region 301 is the region of the reactive material 300 that is to be exposed to the light of the first wavelength. The second regions 302 are the regions of the reactive material 300 that is to be exposed to the light of the second wavelength. The overlap regions 305 are the region of the reactive material 300 that is to be exposed to the light of the first and second wavelengths. Although FIGS. 3A-3F illustrate a reactive material with one first region, two second regions, and two overlap regions, the disclosure is not so limiting, and any number of first regions, second regions, and/or overlap regions can be included, depending on the pattern desired by the operator. In addition, the first, second, and overlap regions can be of any desired shape. In some embodiments, the first and second regions do not overlap, and thus there are no overlap regions. In some embodiments, third regions receiving a third wavelength of light are included.

At operation 220, the reactive layer 110 is exposed to a plurality of wavelengths of light. For example, the light source system 130 exposes the reactive layer 110 to light of the first and second wavelengths. The image formation device 120 directs the light such that the light with the first wavelength is incident on the first region 301, the light with the second wavelength is incident on the second regions 302, and the light with the first wavelength and the light with the second wavelength is incident on the overlap regions 305.

Figure 4A:
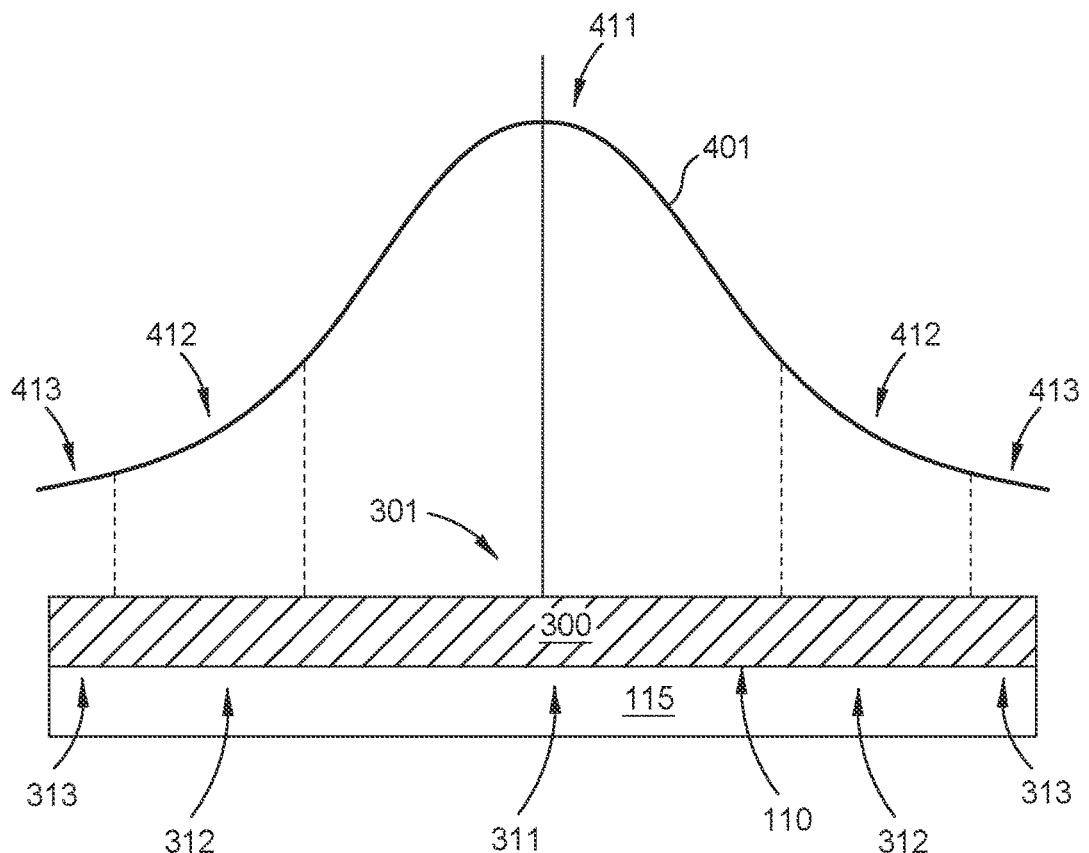
FIGS. 4A-4C illustrate light with a first wavelength of light incident on a reactive layer, according to one or more embodiments described and discussed herein.
Figure 4B:
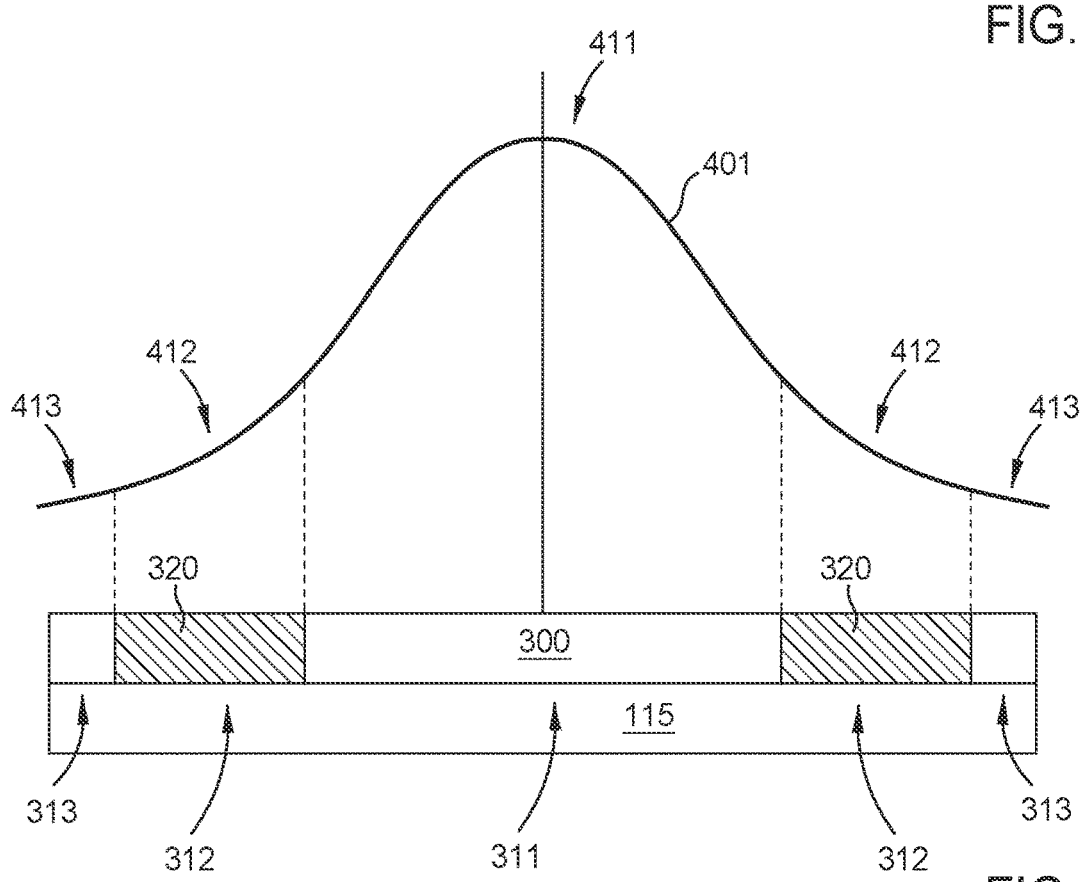
Figure 4C:
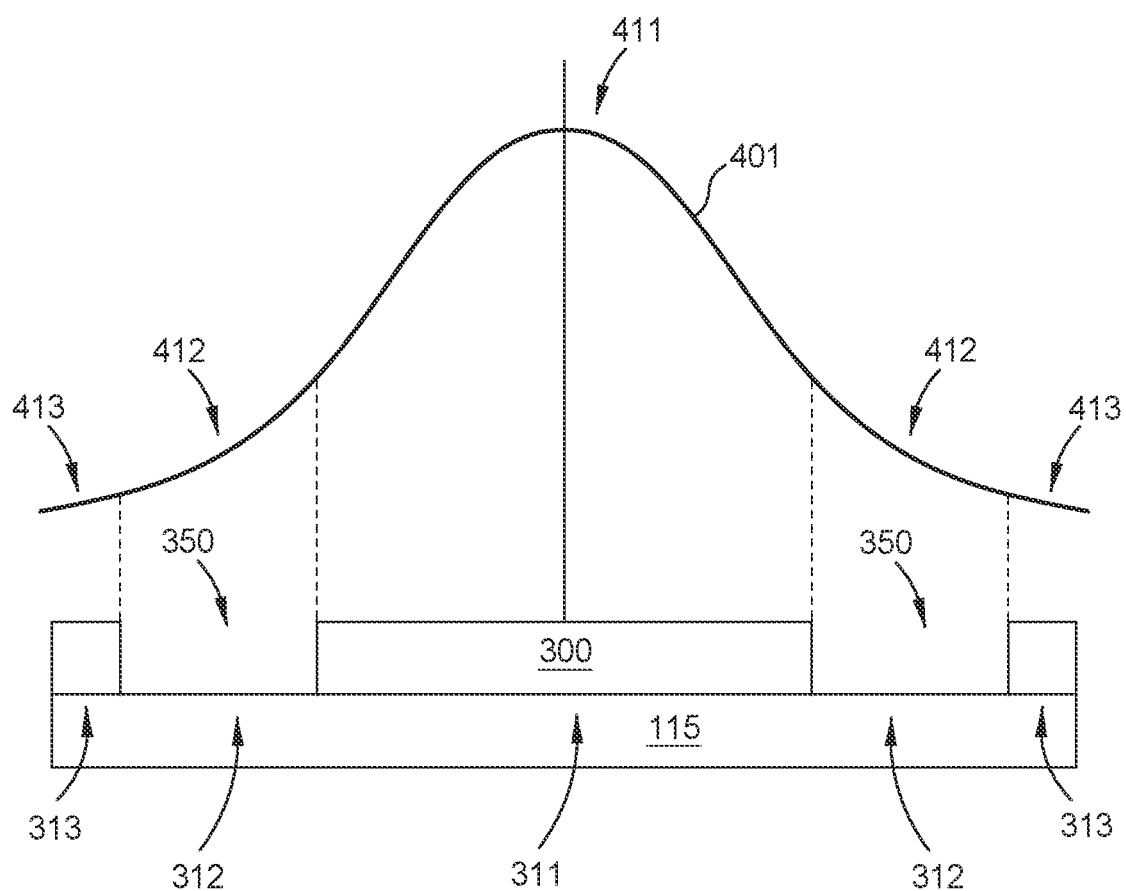

FIGS. 4A-4C illustrate the light with the first wavelength incident on the reactive layer 110, according to one or more embodiments described and discussed herein. FIGS. 4A-4C illustrate the first region 301 of the reactive layer 110. FIG. 4A illustrates the first region 301 when the waveform 401 is just incident on the reactive layer 110, but before the material of the active layer begins reacting from the light. The light has a waveform 401 incident on the reactive layer 110. The waveform 401 illustrated in FIG. 4A has a Gaussian shape, but other shapes of the waveform are contemplated.

As shown, the waveform 401 includes a high dose area 411, two medium dose areas 412, and two low dose areas 413. The high dose area 411 has a higher intensity than the medium dose areas 412. The medium dose areas 412 have higher intensities than the low dose areas 413. The divisions of the waveform 401 into high dose areas 411, medium dose areas 412, and low dose areas 413 depends on the desired effect of the light incident on the reactive layer 110 below. The high dose area 411, medium dose areas 412, and low dose areas 413 are incident on a high dose region 311, medium dose regions 312, and low dose regions 313, respectively, of the first region 301.

In some embodiments, the average intensity of the medium dose areas 412 are about 60% to about 70% of the average intensity of the high dose area 411. In some embodiments, the average intensity of the low dose areas 413 are about 30% to about 40% of the average intensity of the high dose area 411. The combined width of the medium dose areas 412 is about the same as the width of the high dose area 411. The combined width of the low dose areas 413 is about the same as the width of the high dose area 411. The width of the high dose area 411 is from about 50 nm to about 1 µm.

FIG. 4B illustrates the first region 301 when the waveform 401 is incident on the reactive layer 110, and the material of the reactive layer 110 is affected by the waveform 401. In the embodiment illustrated in FIG. 4B, the high dose region 311 and low dose regions 313 do not appreciably react with the light of the first wavelength. However, the medium dose regions 312 react with the light of the first wavelength. The material of the medium dose regions 312 is converted to reacted material 320.

In one or more embodiments, in the high dose region 311, the first PBG produces more basic molecules than the first PAG produces acidic molecules. The higher basicity of the high dose region 311 makes the high dose region have the same solubility as the unreacted portion. The base overwhelms the acid, so there is not net acid to deprotect the resist during the post exposure bake.

In the medium dose regions 312, the first PAG produces more acidic molecules than the first PBG produces basic molecules. The higher acidity of the medium dose regions 312 makes the medium dose regions more soluble than the unreacted first region. The higher acidity of the medium dose region makes the polymer more soluble (e.g., in TMAH aqueous developer) when the post exposure bake drives the acid diffusion and reaction kinetics to deprotect the resist (e.g., cleave the protection groups from the polymer).

In the low dose regions 313, the first PAG produces very few acidic molecules, and the first PBG produces very few basic molecules. The neutrality of the low dose regions 313 have about the same solubility of the unreacted first region. Therefore, the medium dose regions 312 are easier to etch away than the unreacted portions. The high dose region 311 and the low dose regions 313 have slower dissolution rates, thus leaving the reactive layer 110 behind after pattern development.

FIG. 3C illustrates a top view of a portion of the reactive layer 110, according to one or more embodiments described and discussed herein. FIG. 3D illustrates a cross-sectional side view of a portion of the reactive layer 110, according to one or more embodiments described and discussed herein. FIGS. 3C and 3D illustrate the reactive layer 110 after the reactive layer is exposed to the light of the first wavelength and the light of the second wavelength. The edge areas 360 are located at the overlap regions 305. Although the overlap regions 305 are exposed to light of both the first and the second wavelength, the material of the overlap regions are unreacted. However, the medium dose region 312 has been converted to reacted material 320.

In one or more embodiments, the first region 301 and the second region 302 at least partially overlap in the overlap region 305. The dose of light of the second wavelength in the overlap regions 305 is large enough such that the first PBG produces a large number of basic molecules. When the overlap region receives a first wavelength of light, the first PAG produces acidic molecules, but the number of acidic atoms is smaller than the number of basic molecules produced by the first and/or second PBG. Thus, the solubility of the overlap regions 305 is not reduced.

At operation 230, the reactive layer is exposed to a treating process. The treating process can include any treating process in the art. In one or more embodiments, the reactive layer 110 is exposed to a treating process. The treating process includes heating the reactive layer 110 to a temperature of about 70° C. to about 200° C. for a period of about 10 seconds to about 300 seconds, according to one or more embodiments described and discussed herein. The treating process includes exposing the reactive layer 110 to a positive developer solution, such as a developer solution containing about 2% to about 5% TMAH, according to one or more embodiments described and discussed herein. The treating process includes exposing the reactive layer 110 to a negative developer solution, such as a developer solution containing toluene, according to one or more embodiments described and discussed herein.

Figure 3E:
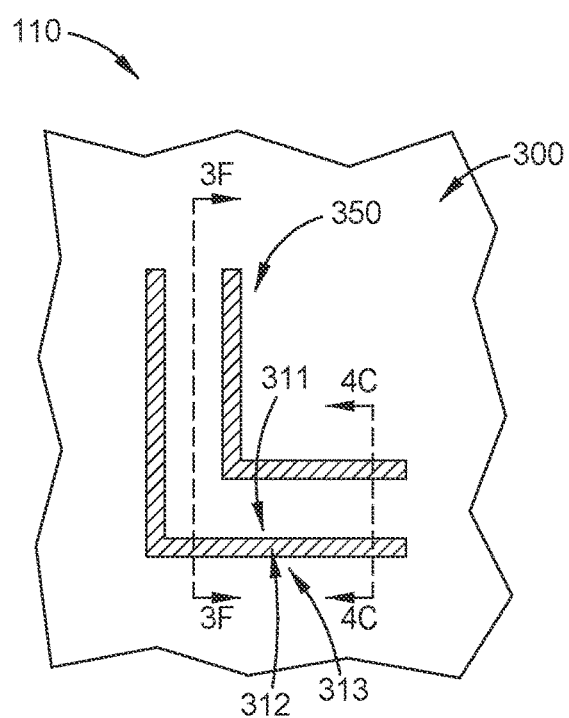
FIG. 3E illustrates a top view of a portion of a reactive layer, according to one or more embodiments described and discussed herein.
Figure 3F:
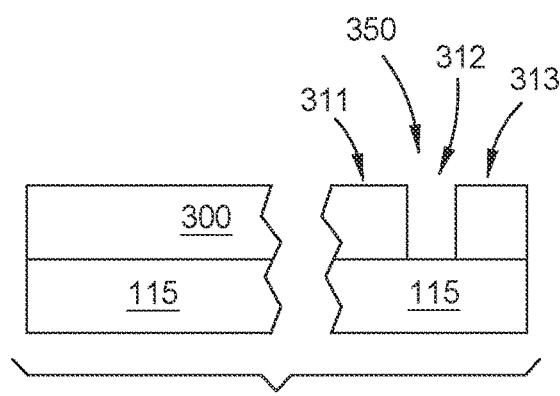
FIG. 3F illustrates a cross-sectional side view of a portion of a reactive layer, according to one or more embodiments described and discussed herein.

FIG. 3E illustrates a top view of a portion of the reactive layer 110, according to one or more embodiments described and discussed herein. FIG. 3F illustrates a cross-sectional side view of a portion of the reactive layer 110, according to one or more embodiments described and discussed herein. FIGS. 3E and 3F illustrate the reactive layer 110 after the reactive layer undergoes the treating process. FIG. 4C illustrates the first region 301 after the treating process. The medium dose regions 312 have been removed to form one or more trenches 350. The trench 350 can have a thickness of about 1 nm to about 100 nm and a width of about 50 nm to about 1 µm.

After the method 200 is complete, a metal layer can be deposited in the trench 350 and the reactive material 300 is removed. Thus, the method 200 can be used to form a circuit containing of the metal layer in a desired shape determined by the method 200.

Although the method 200 is described using a positive photoresist process (e.g., the method 200 causes the reacted material 320 to become more soluble), the same method 200 is applicable to a negative photoresist process. In these embodiments, the medium dose regions 312 become less soluble after being exposed to the first wavelength of light, and the treating process removes the remainder of the reactive layer 110. For example, the reactive layer 110 is exposed to toluene for a period of about 30 seconds to about 300 seconds to remove the reactive layer 110, and the reacted material 320 remains. The method 200 can also be performed us a dual tone photolithography method, including both a positive resist method and a negative resist method.

Although method 200 described above includes different regions of a reactive layer 110 receiving two different wavelength in light, other methods are contemplated. In one or more embodiments, the reactive layer 110 includes two or more different regions, with each region including different photo-active materials. The different photo-active materials are active at different wavelengths of light. The entire reactive layer can be exposed to the different wavelengths of light, and thus the material of the reactive layer reacts to make the desired pattern.

Figure 5A:
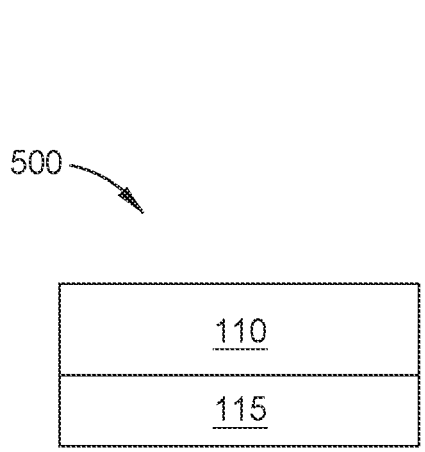
FIGS. 5A-5B illustrate cross-sectional side views of a portion of a workpiece containing a reactive layer at different stages of being processed, according to one or more embodiments described and discussed herein.
Figure 5B:
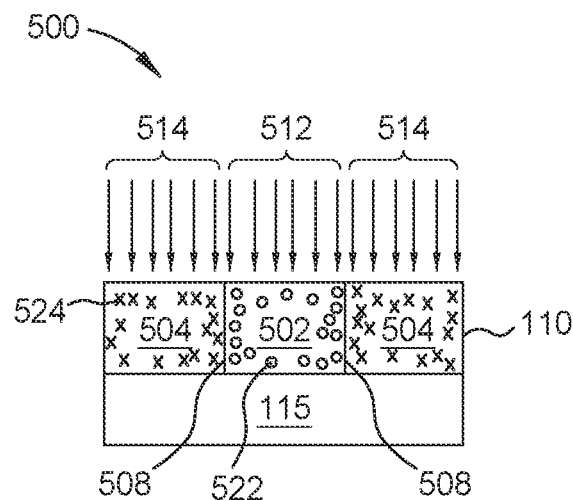
Figure 5C:
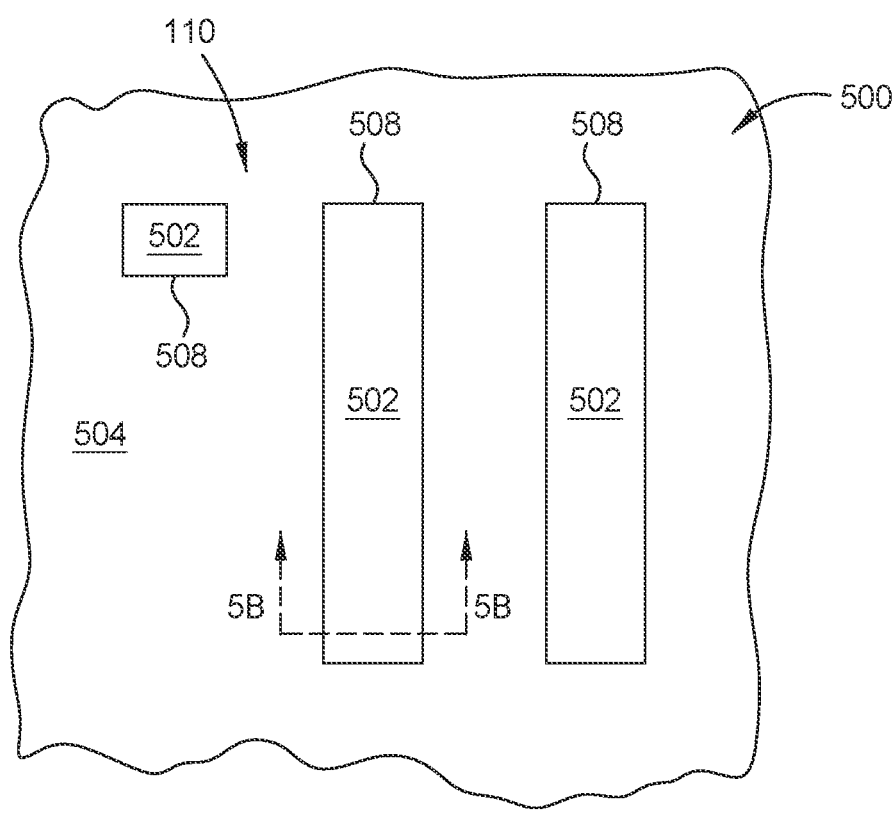
FIG. 5C illustrates a top view of a portion of the workpiece depicted in FIG. 5B, according to one or more embodiments described and discussed herein.

FIGS. 5A-5B illustrate cross-sectional side views of a portion of a workpiece 500 containing the reactive layer 110 at different stages of being processed and FIG. 5C illustrates a top view of a portion of the workpiece 500 depicted in FIG. 5B, according to one or more embodiments described and discussed herein. The workpiece 500 includes the reactive layer 110 containing a reactive material disposed on the substrate 115, as depicted in FIG. 5A. The methods for patterning a layered structure on workpiece 500 can be performed on the lithography apparatus 100, as described and discussed herein.

In one or more embodiments, the reactive material contains one or more polymeric photoresist materials, one or more PAGs, and one or more PBGs. The PAG is active with or activated by a light having a first wavelength and the PBG is active with or activated by a light having a second wavelength different than the first wavelength. The first wavelength is about 240 nm to about 250 nm and the second wavelength is about 350 nm to about 410 nm.

In one or more examples, the polymeric photoresist material is or contains one or more polymer resins (e.g., poly-t-BOC). In one or more examples, the PAG is or contains one or more triflate compounds (e.g., iodonium triflate). In one or more examples, the PBG is or contains a cyanoacrylic acid chromophore and a bicyclic nitrogenous base. One example of the cyanoacrylic acid chromophore incudes (E)-3-(2,2'-bithiophen-5-yl)-2-cyanoacrylic acid chromophore. Examples of the bicyclic nitrogenous base may include 1,8-diazabicyclo[5.4.0]undec-7-ene (DBU) or 1,5,7-triazabicyclo[4.4.0]dec-5-ene (TB D).

The workpiece 500 is exposed to a first light 512 having the first wavelength and a second light 514 having the second wavelength, as depicted by arrows in FIG. 5B. A first pattern region 502 of the reactive material is formed or otherwise produced in the reactive layer 110 (FIG. 5A) when exposed to the first light 512 of the first wavelength. The first pattern region 502 can be or include trenches, vias, contact vias, channels, and/or other apertures, which may have any shape, size, geometry, or pattern. Similarly, a second pattern region 504 of the reactive material is formed or otherwise produced in the reactive layer 110 (FIG. 5A) when exposed to the second light 514 of the second wavelength. The second pattern region 504 can be the negative of the first pattern region 502. In some examples, the first pattern region 502 remains unexposed to the second light 514 having the second wavelength while the second pattern region 504 remains unexposed to the first light 512 having the first wavelength. The exposures of the first pattern region 502 and the second pattern region 504 by the first and second lights 512, 514, respectively, occur simultaneously to each other. For example, an acid is produced in one of the first pattern region 502 or the second pattern region 504 of the reactive material while a base is produced in the other pattern region that is different than the pattern region containing the produced acid. As such, the acid is produced in the first pattern region 502 and the base is produced in the second pattern region 504. Alternatively, the base is produced in the first pattern region 502 and the acid is produced in the second pattern region 504.

In one or more embodiments, the acid produced from the PAG is indicated as o's labeled as 522 within the first pattern region 502 and the base produced from the PBG is indicated as x's labeled as 524 within the second pattern region 504, as depicted in FIG. 5B. In other embodiments, not illustrated, the acid produced from the PAG can be located within the second pattern region 504 and the base produced from the PBG can be located within the first pattern region 502.

In either example, a neutralized zone 508 is produced from a reaction of the acid and the base at the interfaces disposed between the first pattern region 502 and the second pattern region 504. The neutralized zone 508 contains one or more salts produced from the acid and the base at the interface of the pattern regions 502, 504. The neutralized zone 508 provides sharp and crisp edges to the features, such as between the pattern regions 502, 504, which in turn provides enhanced resolution in the lithography processes described and discussed herein compared to conventional lithography processes. The neutralized zone 508 provides the region between the forward reaction occurring in one region, such as the pattern region 502 or 504, and the blocking of the forward reaction occurring in neighboring region. For example, the acid in the reactive material with the pattern region 502 or 504 removes a protection group on the polymeric photoresist material and the base the reactive material within the other pattern region 502 or 504 blocks de-protection of a protection group on the polymeric photoresist material.

As described and discussed above at operation 230, the workpiece 500 containing the first and second pattern regions 502, 504 can be exposed to the treating process. The first pattern region 502 and the second pattern region 504 are exposed to one or more developer solutions during the treatment process. In one or more examples, the first pattern region 502 of the reactive material is removed and the second pattern region 504 of the reactive material is maintained during the treatment process. The developer solution can be a positive developer solution which contains one or more developer bases. Alternatively, the developer solution can be a negative developer solution which contains one or more developer acids.

In some embodiments, the method of patterning a layered structure includes simultaneously exposing the first pattern region 502 of the reactive material to the first light 512 of the first wavelength and the second pattern region 504 of the reactive material to the second light 514 of the second wavelength, producing an acid in the first pattern region 502 of the reactive material while producing a base in the second pattern region 504 of the reactive material, and producing the neutralized zone 508 from the produced acid and the produced base at an interface between the first and second pattern regions 502, 504. The method also includes exposing the first pattern region 502 and the second pattern region 504 of the reactive material to a developer solution (e.g., positive developer solution) during a treatment process, such that the first pattern region 502 of the reactive material is removed and the second pattern region 504 of the reactive material is maintained during the treatment process. In other examples, the developer solution is a negative developer solution, such that the first pattern region 502 of the reactive material is maintained and the second pattern region 504 of the reactive material is removed during the treatment process.

In one or more embodiments, the reactive material in the reactive layer contains one or more polymeric photoresist materials, one, two, or more cross-link inhibitors, and optionally one or more quenchers. In some examples, the reactive material contains one or more polymeric photoresist materials, a first cross-link inhibitor, and a second cross-link inhibitor. In other examples, the reactive material contains one or more polymeric photoresist materials, a cross-link inhibitor, and one or more quenchers.

In one or more embodiments, a method of patterning a layered structure includes disposing the reactive material over the layered structure and/or substrate. The reactive material contains a polymeric photoresist material, a first cross-link inhibitor, and a second cross-link inhibitor. The first cross-link inhibitor is active at a first wavelength and the second cross-link inhibitor is active at a second wavelength different than the first wavelength. The method also includes simultaneously exposing a first pattern region of the reactive material to a first light of the first wavelength and a second pattern region of the reactive material to a second light of the second wavelength, producing a first activated cross-link inhibitor in the first pattern region of the reactive material while producing a second activated cross-link inhibitor in the second pattern region of the reactive material, and producing a neutralized zone from the first activated cross-link inhibitor and the second activated cross-link inhibitor at an interface between the first pattern region and the second pattern region.

Figure 6:
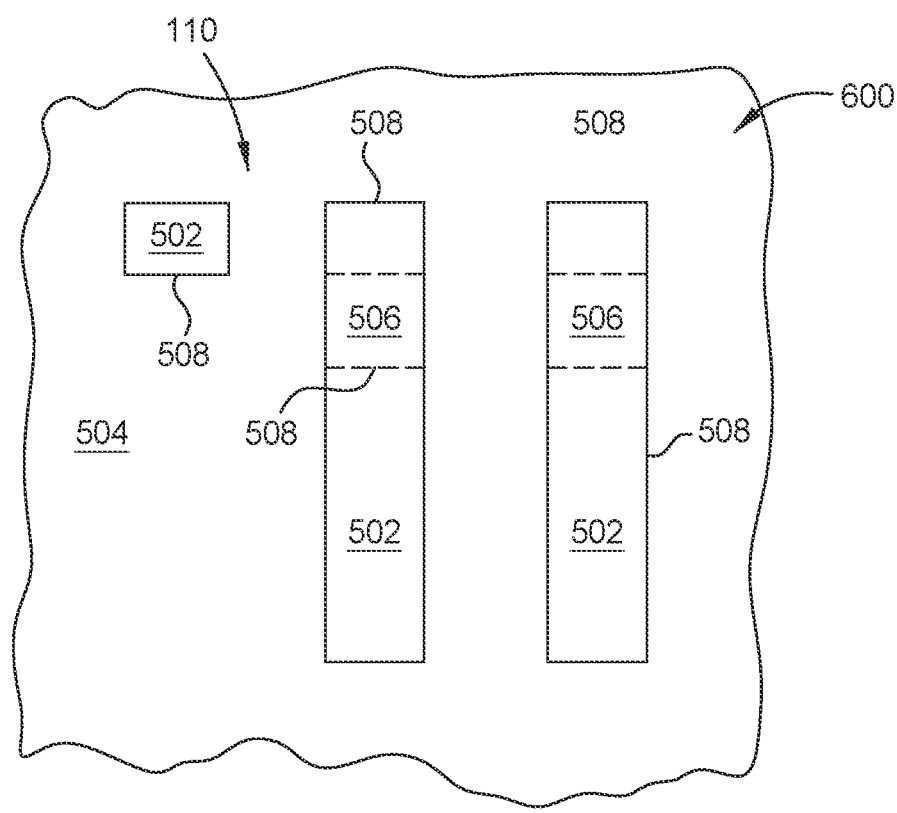
FIG. 6 illustrates a top view of a portion of a workpiece containing a reactive layer at one process stage, according to one or more embodiments described and discussed herein.

FIG. 6 illustrates a top view of a portion of a workpiece 600 containing a reactive layer 110 at one process stage, according to one or more embodiments described and discussed herein. The workpiece 600 is similar to the workpiece 500, but the workpiece 600 also has a third pattern region 506 of the reactive material which is exposed to both the first and second lights, as depicted in FIG. 6. The third pattern region 506 can be a cut area or region on the workpiece 600. As such, the reactive material in The third pattern region 506 can remain on the workpiece 600 along with the reactive material in the second pattern region 504 upon removal of the reactive material in the first pattern region 502 during the treatment process at operation 230.

In one or more embodiments, the workpiece 600 includes the reactive layer 110 containing the reactive material disposed over a layered structure or substrate. The reactive material contains one or more polymeric photoresist materials, one or more PAGs, and one or more PBGs. The PAG is active at a first wavelength and the PBG is active at a second wavelength different than the first wavelength. The method includes simultaneously exposing the first pattern region 502 of the reactive material to a first light of the first wavelength, the second pattern region 504 of the reactive material to a second light of the second wavelength, and exposing a third pattern region 506 of the reactive material to the first light of the first wavelength and the second light of the second wavelength. In some examples, the third pattern region 506 is a portion of the first pattern region 502, as depicted in FIG. 6. In other examples, the third pattern region 506 is a portion of the second pattern region 504 (not shown). In further examples, the third pattern region 506 is a portion of both the first and second pattern regions 502, 504 (not shown).

The method also includes producing an acid from the PAG in the first pattern region 502 of the reactive material while producing a base from the PBG in the second pattern region 504 and the third pattern region 506 of the reactive material. The neutralized zone 508 is disposed at the interface between the first pattern region 502 and the second pattern region 504, as well as the first pattern region 502 and the third pattern region 506. In one or more examples, the first pattern region 502 remains unexposed to the second light having the second wavelength while the second pattern region 504 remains unexposed to the first light having the first wavelength, while the third pattern region 506 is exposed to the first light having the first wavelength and the second light having the second wavelength.

As described above, a lithography apparatus, patterning system, and method of patterning a layered structure is provided. The patterning system includes an image formation g device and a reactive layer. The patterning system allows for creating lithography patterns. The lithography apparatus includes the patterning system and an optical system. The lithography apparatus uses a plurality of wavelengths of light, along with the image formation device, to form a plurality of different color images and/or patterns on the reactive layer. The method of patterning includes exposing the reactive layer to a plurality of different wavelength patterns of light. The reactive layer reacts differently with different wavelengths of light to enable a plurality of color images and/or one or more compound images to be formed in a single lithography step.

The method and apparatuses disclosed herein require one lithography step, which generates the net compound image that otherwise would have required multiple lithography steps and multiple masks. In addition, the use of an image formation device reduces the need for alignment of multiple masks, reducing time of lithography.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated.

As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A lithography apparatus, comprising:
a substrate support configured to support a layered structure;
a light source system able to emit light at two or more wavelengths including a first wavelength and a second wavelength; and
an image formation device, the image formation device comprising:
a first device region able to receive the light of the first wavelength and generate a first light image at the first wavelength to be projected to a first region of the layered structure, at the first region of the layered structure the first device region of the image formation device is configured to generate a high dose at a high dose region, a medium dose at a medium dose region, and a low dose at a low dose region of the first region; and
a second device region able to receive the light of the second wavelength and generate a second light image at the second wavelength to be projected to a second region of the layered structure, at the second region of the layered structure the second device region of the image formation device is configured to generate a high dose at a high dose region, a medium dose at a medium dose region, and a low dose at a low dose region of the second region.

2. The lithography apparatus of claim 1, wherein
the light source system comprises a light source configured to emit the light at the two or more wavelengths,
the image formation device comprises a digital micromirror device (DMD), and
the DMD is configured to project light images at the two or more wavelengths.

3. The lithography apparatus of claim 1, wherein
the image formation device comprises a first DMD and a second DMD,
the first DMD is configured to project the light at the first wavelength of the two or more wavelengths, and
the second DMD is configured to project the light at the second wavelength of the two or more wavelengths.

4. The lithography apparatus of claim 1, wherein
the image formation device comprises a first photomask and a second photomask,
the first photomask is configured to project the light at the first wavelength of the two or more wavelengths, and
the second photomask is configured to project the light at the second wavelength of the two or more wavelengths.

5. The lithography apparatus of claim 1, wherein
the light source system comprises a light source configured to emit light at the two or more wavelengths,
the image formation device comprises a photomask, and
the photomask is configured to project light images at the two or more wavelengths.

6. The lithography apparatus of claim 1, wherein
a portion of the second light image projected to the second region at least partially overlaps with the first light image projected to the first region.

7. A patterning system, comprising:
an image formation device, the image formation device comprising:
a first device region able to generate a first light image at a first wavelength to be projected to a first region of a reactive layer, at the first region of the reactive layer, the first device region of the image formation device generates a high dose at a high dose region, a medium dose at a medium dose region, and a low dose at a low dose region of the first region of the reactive layer; and
a second device region able to generate a second light image at a second wavelength to be projected to a second region of the reactive layer, at the second region of the reactive layer the second device region of the image formation device is configured to generate a high dose at a high dose region, a medium dose at a medium dose region, and a low dose at a low dose region of the second region of the reactive layer; and
the reactive layer comprising a reactive material comprising:
the first region; and
the second region; wherein
the image formation device is configured to allow the first light image onto the first region, and
the image formation device is configured to allow the second light image onto the second region.

8. The patterning system of claim 7, wherein
the image formation device is configured to allow a higher dose of the first wavelength of light in the high dose region than the medium dose region, and
the image formation device is configured to allow a higher dose of the first wavelength of light in the medium dose region than the low dose region.

9. The patterning system of claim 8, wherein the reactive layer comprises a photoresist.

10. The patterning system of claim 9, wherein the reactive material comprises a first photoacid generator (PAG) and a first photobase generator (PBG), and each of the first PAG and the first PBG are photo-active at the first wavelength of light.

11. The patterning system of claim 9, wherein the image formation device comprises one or more digital micromirror devices (DMDs).

12. The patterning system of claim 9, wherein the image formation device comprises one or more photomasks.

13. The patterning system of claim 7, wherein
a portion of the second light image projected to the second region at least partially overlaps with the first light image projected to the first region.

14. A method of patterning a layered structure, comprising:
disposing a reactive layer over the layered structure; and
exposing the reactive layer to a plurality of wavelengths of light through an image formation device, the image formation device comprising:
a first device region able to generate a first light image at a first wavelength to be projected to a first region of the reactive layer; and
a second device region able to generate a second light image at a second wavelength to be projected to a second region of the reactive layer;
the reactive layer comprising a reactive material comprising the first region and the second region, the exposing the reactive layer comprising:
exposing the first region to light of the first wavelength with the image formation device, at the first region of the reactive layer the first device region of the image formation device generates a high dose at a high dose region, a medium dose at a medium dose region, and a low dose at a low dose region of the first region of the reactive layer; and
exposing the second region to light of the second wavelength with the image formation device, at the second region of the reactive layer, the second device region of the image formation device generates a high dose at a high dose region, a medium dose at a medium dose region, and a low dose at a low dose region of the second region of the reactive layer.

15. The method of claim 14, wherein the reactive layer comprises a photoresist and the image formation device comprises one or more digital micromirror devices (DMDs).

16. The method of claim 15, wherein the reactive material comprises a first photoacid generator (PAG) and a first photobase generator (PBG), wherein each of the first PAG and the first PBG are active at the first wavelength.

17. The method of claim 16, wherein the reactive material further comprises a second PBG active at the second wavelength.

18. The method of claim 14, wherein the exposing the first region and the second region occur simultaneously.

19. The method of claim 14, wherein the exposing the first region and the second region occur sequentially, and the exposing the first region and the second region are repeated one or more times.

20. The method of claim 14, wherein the reactive layer comprises a photoresist.

21. The method of claim 14, wherein the first region and the second region at least partially overlap.

22. The method of claim 14, wherein the image formation device is configured to allow a higher dose of the light of the first wavelength in the high dose region than the medium dose region, and the image formation device is configured to allow a higher dose of the light of the first wavelength in the medium dose region than the low dose region.

* * * * *